United States Patent [19]
Martin et al.

[11] Patent Number: 5,982,647
[45] Date of Patent: Nov. 9, 1999

[54] CONTACTLESS INTEGRATED CIRCUIT COMPRISING A CHARGE PUMP

[75] Inventors: Michel Martin, Rognes; Jacek Kowalski, Trets, both of France

[73] Assignee: Inside Technologies, Saint Clément Les Place, France

[21] Appl. No.: 09/237,108

[22] Filed: Jan. 26, 1999

Related U.S. Application Data

[63] Continuation of application No. PCT/FR97/01128, Jun. 25, 1997.

[30] Foreign Application Priority Data

Aug. 6, 1996 [FR] France ................................. 96 09909

[51] Int. Cl.$^6$ ...................................................... H02M 3/07
[52] U.S. Cl. ............................................... 363/59; 363/60
[58] Field of Search ................................... 363/59, 60, 61

[56] References Cited

U.S. PATENT DOCUMENTS

| | | | |
|---|---|---|---|
| 4,186,436 | 1/1980 | Ishiwatari | 363/60 |
| 4,812,961 | 3/1989 | Essaf et al. | 363/61 |
| 4,839,787 | 6/1989 | Kojima et al. | 363/60 |
| 4,922,402 | 5/1990 | Olivo et al. | 363/60 |
| 5,006,974 | 4/1991 | Kazerounian et al. | 363/60 |
| 5,159,543 | 10/1992 | Yamawaki | 363/60 |
| 5,206,945 | 4/1993 | Kreft | 235/492 |
| 5,280,420 | 1/1994 | Rapp | 363/60 |
| 5,285,370 | 2/1994 | Axer et al. | 363/59 |
| 5,499,183 | 3/1996 | Kobatake | 363/59 |
| 5,625,544 | 4/1997 | Kowshik et al. | 363/59 |
| 5,635,776 | 6/1997 | Imi | 363/60 |
| 5,680,300 | 10/1997 | Szepesi et al. | 363/59 |

*Primary Examiner*—Jeffrey Sterrett
*Attorney, Agent, or Firm*—Akin, Gump, Strauss, Hauer & Feld, L.L.P.

[57] ABSTRACT

An integrated circuit (30) for non-contact operation by means of at least one coil (L) forming a tuned resonant circuit with a tuning capacitor ($C_A$), including a charge pump (10) with two clock inputs ($E_1$ $E_2$), wherein the clock inputs ($E_1$ $E_2$) of the charge pump (10) are constantly connected to the terminals of the coil (L), at least during the periods of non-contact operation of the integrated circuit, whereby the charge pump, seen from the clock inputs thereof, is a constant component of the tuning capacitor of the tuned resonant circuit.

10 Claims, 2 Drawing Sheets

CONTACTLESS INTEGRATED CIRCUIT COMPRISING A CHARGE PUMP

CROSS-REFERENCE TO RELATED APPLICATION

This application is a continuation of International Application PCT/FR97/01128, filed Jun. 25, 1997, the disclosure of which is incorporated herein by reference.

BACKGROUND OF THE INVENTION

The present invention relates to an integrated circuit capable to operate without contact by means of at least one coil forming a tuned resonant circuit with a tuning capacity, and comprising a charge pump with two clock inputs.

The integrated circuits used to implement chip cards, electronic labels and in a general way integrated circuits mounted on portable supports comprise generally an EEPROM memory (electrically erasable and programmable memory) to record and store data, as well as a booster circuit to produce a high voltage for programming or erasing said memory. As a matter of fact, a programming or erasing voltage of an EEPROM memory is typically about 15 to 20 V, when the supply voltage Vcc of an integrated circuit is about 3 to 5 V only.

In the field of microelectronics, the preferred embodiment of a booster circuit is a charge pump, which is easy to integrate on silicon.

The problem when using a charge pump is however that it must be driven by clock signals. Such signals must be provided by an oscillator, which generally consumes some current. In the case of a contactless integrated circuit supplied by electromagnetic induction and having low energetic resources, such a current consumption may be not desirable.

Before dealing with this technical problem in more details, the conventional structure of a charge pump and the conventional arrangement of such a charge pump in a contactless integrated circuit will be recalled.

The charge pump shown in FIG. 1 comprises a plurality of capacities arranged in cascade, for example N capacities $C_1$ to $C_N$. The anode of each capacity $C_1$, $C_2$, ... is coupled to the anode of the following capacity $C_2$, $C_3$, ... by means of MOS transistors $T_1$ to $T_N$ having their gate fed back to their drain and equivalent to diodes. At the end of the chain, the transistor $T_N$ Couples the anode of the capacity $C_N$ to the anode of a storing capacity $C_{hv}$ whose cathode is connected to ground. The cathodes of the odd numbered capacities $C_1$, $C_3$ ... are driven by a clock signal Hi applied to one input $E_1$ of the charge pump and the cathodes of the even numbered capacities $C_2$, $C_4$, ... are driven by a signal $H_2$ applied to one input $E_2$, the signal $H_2$ having its phase opposite with respect to the signal $H_1$. Thus, alternately, each odd numbered capacity $C_1$, $C_3$, ... discharges into the following even numbered capacity $C_2$, $C_4$ ..., and each even numbered capacity $C_2$, $C_4$, ... discharges into the following odd numbered capacity $C_3$, $C_5$, ... At the end of the chain, the capacity $C_N$ discharges into the capacity $C_{hv}$ whose terminals, present a high voltage $V_{hv}$.

FIG. 2 represents a conventional arrangement of the charge pump 10 within a contactless integrated circuit 20. The integrated circuit 20 comprises a coil L forming a tuned resonant circuit LCa with a tuning capacity Ca, allowing the integrated circuit to receive an alternating voltage Va by electromagnetic induction. The charge pump 10 is connected by its clock inputs $E_1$ and $E_2$ to an oscillator 15 which is controlled by a signal PGR and produces the clock signals $H_1$ and $H_2$. The oscillator 15 receives a supply voltage Vcc from a rectifier bridge Pd using diodes or transistors, which receives the induced alternating voltage Va at its input and comprises a filtering capacity Cf at its output. A conventional embodiment of the oscillator 15 is shown in FIG. 3. Three cascading inverting gates $I_1$, $I_2$, $I_3$ are arranged in closed loop by means of an AND gate referenced A1 and controlled by the signal PGR. The signal $H_1$ is for example taken at the output of the last gate $I_3$ and the inverse signal $H_2$ provided by a fourth inverting gate $I_4$.

The tuning capacity Ca is generally an adjustable capacity, adjusted so that the resonance frequency of the circuit LCa is as close as possible to the oscillating frequency of the magnetic field in which the integrated circuit 20 is intended to work. As shown, the tuning capacity Ca for example comprises several capacities $Ca_1$ to $Ca_n$ in parallel, the metallic tracks enabling the connection of some capacities having been cut at the time of adjusting.

Thus, when an erasing or writing operation of an EEPROM memory (not shown) has to be performed, the signal PGR is set to 1, the gate A1 becomes transparent, the oscillator 15 starts and the charge pump 10 is activated.

As mentioned above, the working of the oscillator 15 implies a non-negligible current consumption, due to the fast commutation of the various inverting gates. At the start of an erasing or programming operation, when the signal PGR is set to 1, this consumption is added to the consumption of the charge pump 10 which has to perform the charge of the storing capacity NChv. Furthermore, in a contactless chip card or an electronic label, such an erasing or programming operation can be started when the reception conditions of the induced voltage Va are bad. Thus, if the energy received by the coil L is too week, the supply voltage Vcc may drop, causing the end of the working of the integrated circuit.

It is thus desirable, in a contactless integrated circuit, to reduce as much as possible the current consumption during the periods when the high voltage Vhv is generated.

In the state of the art, there is also known a method consisting in directly activating a charge pump by means of the positive and negative half waves of an alternating voltage induced in a coil.

This method, illustrated in FIG. 4, consists in connecting the two terminals of the coil L to the two inputs $E_1$ and $E_2$ of the charge pump by means of two switches 16, 17 controlled by the programming signal PGR. When the signal PGR is at 1, the switches 16, 17 are closed and the half waves Va1 and Va2 are directly sent to the charge pump 10 as the activation signals $H_1$ and $H_2$.

However, the applicant has remarked that this method, although allowing the suppression of the oscillator 15, has the drawback of detuning the resonant circuit LCa.

As a matter of fact, referring to the diagram of FIG. 1, a charge pump considered from its inputs $E_1$ and $E_2$ is equivalent to a capacity $C_E$ with a value $$C_E = N\,C/2 \qquad (2)$$

N being the number of stages of the charge pump and C the value of the capacities $C_1$, $C_2$, ... $C_N$ of each stage.

Therefore, in FIG. 4, when the signal PGR switches to 1 and the charge pump 10 is so connected to the coil L, the capacity $C_E$ substantially detunes the resonant circuit LCa and the energy reception is done in bad conditions.

The aim of the present invention is to reduce this drawback.

U.S. Pat. No. 5,206,495 describes a chip card with two operating modes, contact or contactless, comprising an integrated circuit, a contact field to operate in the contact mode, and two coils to operate in the contactless mode.

U.S. Pat. No. 5,285,370 describes a device wherein the voltage that is induced on the terminals of a coil is used to activate the clock inputs of a charge pump. However, the device is provided with a "wide band" inductive coil without tuning capacitor, which does not form a resonant circuit. Moreover, this document recommends to dispose a switch between the coil and the clock inputs of the charge pump, so that the coil is connected to the charge pump only when necessary.

SUMMARY OF THE INVENTION

Thus, the present invention has the object of allowing the direct activation of a charge pump by means of the coil of a resonant circuit, without however detuning the resonant circuit.

To achieve this purpose, the present invention lies on the simple but nevertheless inventive idea to connect permanently the charge pump to the coil, so that the input capacity $C_E$ of the charge pump is an integral part of the tuning capacity Ca of the resonant circuit.

The implementation of the invention implies the resonant circuit to be tuned taking into account the input capacitance of the charge pump.

More particularly, the present invention provides an integrated circuit able to operate without contact by means of at least one coil forming a tuned resonant circuit with a tuned capacity, comprising a charge pump with two clock inputs, wherein, at least during contactless operating periods of the integrated circuit, the clock inputs of the charge pump are permanently connected to the coil terminals, the charge pump capacity seen from its clock inputs forming a permanent component of the tuning capacity of the tuned resonant circuit.

According to one embodiment, the clock inputs of the charge pump are directly connected to the coil terminals.

According to one embodiment, the clock inputs of the charge pump are connected to the coil terminals by means of first switches, which are closed at least during periods when the integrated circuit works contactless.

For example, when the integrated circuit presents two operating modes, contact or contactless, the first switches are controlled by a signal representative of the operating mode of the integrated circuit.

In this case, according to one embodiment, the clock inputs of the charge pump are furthermore connected to the outputs of an oscillator by means of second switches.

The present invention also relates to a portable support comprising an integrated circuit according to the invention, and in particular to a chip card.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 5:
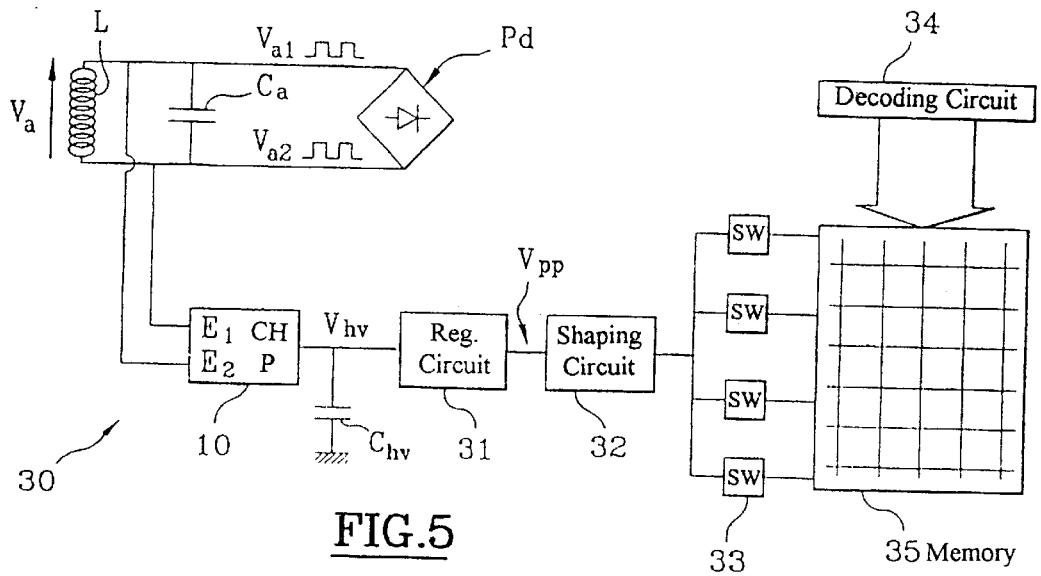
FIG. 5 represents an arrangement of a charge pump in a contactless operating integrated circuit according to the invention.

FIG. 5 represents an arrangement according to the invention, in a contactless operating integrated circuit 30, of the charge pump 10 already described in the preamble. In the circuit 30, the coil L, the adjusted capacity Ca and the rectifier bridge Pd already described can be found again. According to the invention, the activation inputs $E_1$ and $E_2$ of the charge pump 10 are directly connected to the two terminals of the coil L and receive continuously the half waves Va1, Va2 of the alternating voltage Va, when the latter is present. The charge pump 10 is then permanently active and the capacity Chv for storing the high voltage Vhv is always charged.

Figure 6:
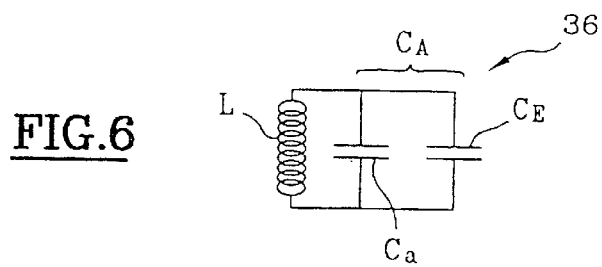
FIG. 6 represents the equivalent circuit of a tuned resonant circuit present in the integrated circuit of FIG. 5.

The advantage of the invention appears in FIG. 6, which represents the equivalent electrical diagram of the tuned resonant circuit 36 of the integrated circuit 30. The resonant circuit 36 comprises the coil L, the adjusted capacity Ca and the equivalent capacity $C_E$ Of the charge pump 10 seen from its inputs $E_1$ and $E_2$. The capacity $C_E$ is part of the tuning capacity $C_A$ Of thus an integral the resonant circuit, which is no more equal to the adjusted capacity Ca as in the prior art, but equal to $$C_A CaC_E \qquad (3)$$

Thus, the present invention allows the suppression of the oscilator of the prior art without the drawbacks linked to a temporary commutation of the charge pump.

Of course, when adjusting or designing the integrated circuit according to the invention, the value of the charge pump capacity $C_E$ is taken into account.

Thus, the charge pump is permanently activated instead of being activated only when necessary, for example during programming or erasing periods of a memory.

The man skilled in the art will note that the method of the invention has finally only advantages. In particular, the fact that the high voltage capacity Chv is permanently precharged is an advantage insofar as the high voltage Vhv is available at any moment without the conventional surconsuming due to the starting of the charge pump. This advantage is particularly useful when the integrated circuit starts a programming or erasing operation when it is far from the source of the magnetic field (the emitting coil of a contactless chip card reader, for example), and the energy received by the coil L is very small. Finally, still another advantage of the present invention is that the adjusted capacity Ca can be reduced by the value $C_E$, and requires thus less space on the silicon surface of the integrated circuit.

Of course, the fact that the capacity Chv is permanently precharged does not mean that a memory programming or erasing operation is permanently performed. To have a better idea, there is schematically shown in FIG. 5 a chain of conventional elements allowing, from the voltage Vhv, to programme a memory 35. The high voltage Vhv is first of all applied to a regulating circuit 31 which produces a regulated high voltage Vpp chosen according to the characteristics of the memory 35. Then, the voltage Vpp is sent to a shaping circuit 32, generally a ramp generating circuit, which allows the progressive application of the voltage Vpp to the memory 35. Lastly, the voltage ramp Vpp is applied to the memory 35 by means of high voltage switches 33 and address decoding circuits 34 enabling the selection of the areas which must be programmed or erased. All these elements must thus be activated to programme or erase the memory 35.

Figure 7:
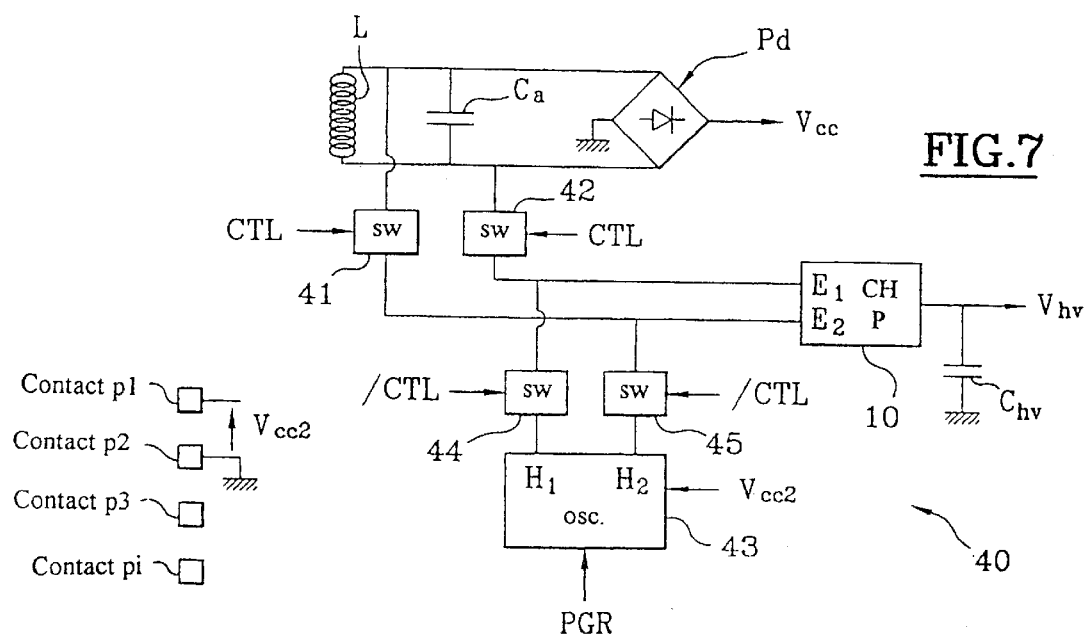
FIG. 7 represents an arrangement of a charge pump according to the invention in an integrated circuit with two operating modes, contact or contactless.

FIG. 7 illustrates an advantageous application of the present invention to an integrated circuit 40 with two operating modes, contact or contactless. Except the already described elements, the integrated circuit 40 comprises various contacts p1, p2 ... pi, in particular a supply contact p1 or receiving a supply voltage Vcc2 and a grounding contact p2. The inputs $E_1$, $E_2$ of the charge pump 10 are now connected to the terminals of the coil L by means of two switches 41, 42 and to the outputs H1, H2 of an oscillator 43 by means of two other switches 45. According to the invention, the switches 41, 42 are controlled by a signal CTL representative of the operating mode, contact or contactless, of the integrated circuit. The switches 44, 45 are, for example, controlled by an inverse signal /CTL. When the integrated circuit 40 works in the contactless mode, the signal CTL is at 1 and the signal /CTL is at 0. The switches 41, 42 are closed, the switches 44, 45 are open and the charge pump 10 is then continuously connected to the terminals of the coil L. Conversely, when the signal CTL is at 0 and the signal /CTL is at 1, the switches 41, 42 are open and the switches 44, 45 are closed. The integrated circuit 40 works as a conventional integrated circuit operating with contact. In particular, the oscillator 43 can be temporarily activated by means of a signal PGR.

The signal CTL allowing the discrimination of the operating mode of the integrated circuit 40 can be generated by various ways, for example by detecting the presence of the supply voltage Vcc2 on the contact p1, or the presence of the voltage Va on the coil L or also the presence of the voltage Vcc at the output of the rectifier bridge Pd.

It will be apparent to the man skilled in the art that the present invention is open to many alternatives, embodiments and improvements.

Thus, according to an alternative, the closing of the switches 44, 45 in the contact mode is not activated by the signal /CTL, but by a temporary signal specific to programming or erasing operations, for example the signal PGR.

According to another alternative, the oscillator 43 is continuously activated in the contact mode so that the capacity Chv is precharged if the integrated circuit 40 suddenly switches from the contact mode to the contactless mode.

Figure 1:
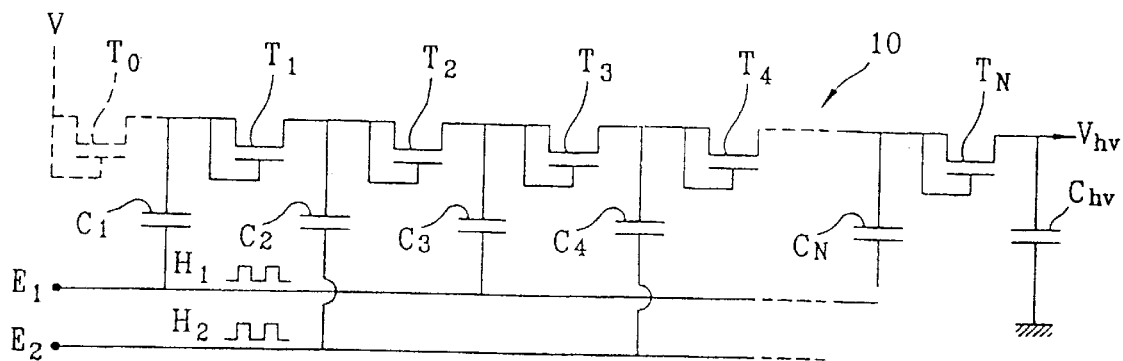
FIG. 1, previously described, is the electrical diagram of a charge pump.
Figure 2:
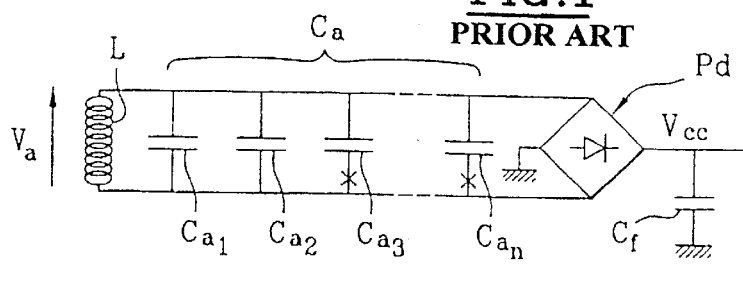
FIG. 2, previously described, represents a conventional arrangement of a charge pump in a contactless operating integrated circuit, FIG. 3, previously described, is the electrical diagram of an oscillator, FIG. 4, previously described, represents another conventional arrangement of a charge PUMP in a contactless operating integrated circuit.
Figure 3:
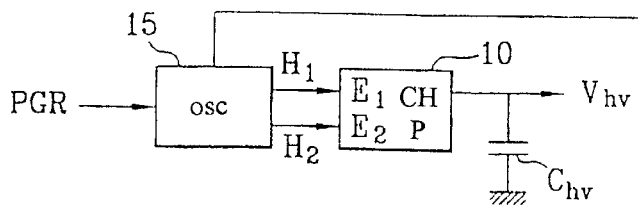
Figure 4:
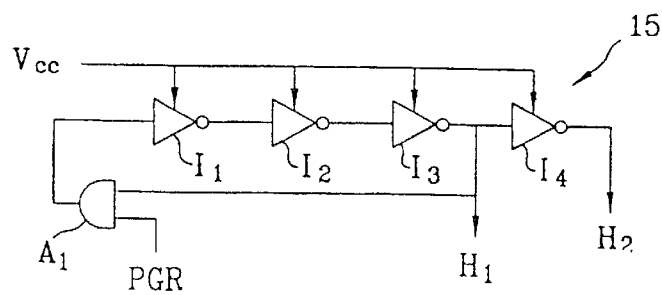
Figure 4:
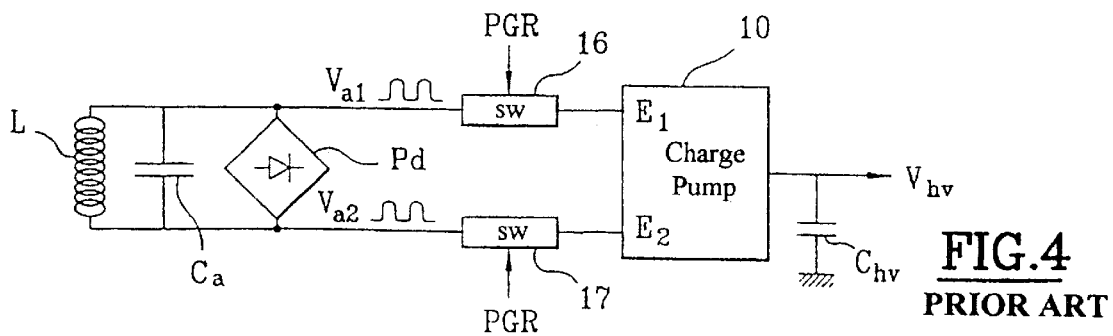

Moreover, to increase the power of the charge pump 10, the charge pump may be supplied by a voltage V via a diode-transistor To, as represented in FIG. 1 with a dotted line. The voltage V may be for example the voltage Vcc provided by the rectifying bridge Pd or the voltage Vcc2 provided by the contact p.

Furthermore, it is obvious that, in the present application and in the claims, the wording "charge pump" does not mean only the circuit represented in figure ill but means in a general way any booster circuit which, considered from its activation inputs, can be assimilated to a capacity.

Also, although the problem solved by the present 'invention has been presented as relating to integrated circuits comprising an EEPROM memory, it is obvious that the present invention can be applied to any integrated circuit comprising a charge pump, whatever the function of the charge pump in the integrated circuit may be.

Finally, although it has been previously indicated that the tuning of the resonant circuit could be obtained by adjusting the capacity Ca, it is obvious that the resonant circuit can be tuned at the design stage of the integrated circuit, if allowed by the manufacturing tolerances.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. Integrated circuit (30) comprising a charge pump (10) with two clock inputs ($E_1$, $E_2$) and operating without contact by means of at least one coil (L) forming with a tuning capacitance ($C_A$) a tuned resonant circuit (36), characterised in that, during the operating periods of the integrated circuit:

the clock inputs ($E_1$, $E_2$) of the charge pump (10) are permanently connected to the terminals of the coil (L), and the capacitance ($C_E$) of the charge pump seen from its clock inputs ($E_1$, $E_2$) forms a permanent component of the tuning capacitance ($C_A$) of the tuned resonant circuit (36).

2. Integrated circuit (30) according to claim 1, wherein the clock inputs ($E_1$, $E_2$) of the charge pump (10) are directly connected to the terminals of the coil (L).

3. Integrated circuit according to claim 1, wherein the charge pump (10) comprises a plurality of capacitors ($C_1$–$C_N$) arranged in cascade, separated by diodes ($T_1$–$T_N$) and connected to the one or the other of the clock inputs ($E_1$, $E_2$) of the charge pump.

4. An integrated circuit according to claim 1 further comprising a portable support.

5. An integrated circuit according to claim 1 further comprising a chip card.

6. Integrated circuit (40) with two operating modes, contact or contactless, comprising:

a charge pump (10) with two clock inputs ($E_1$, $E_2$), at least one coil (L) forming with a tuning capacitance ($C_A$) a tuned resonant circuit (36) for receiving an alternating supply voltage (Va) in the contactless operating mode, and contacts (p1, p2, pi) for receiving a DC supply voltage (Vcc2) in the contact operating mode, characterised in that:

the clock inputs ($E_1$, $E_2$) of the charge pump (10) are connected to the terminals of the coil (L) by means of first switches (41, 42), said first switches (41, 42) are commanded (CTL) to be permanently closed during the contactless operating periods of the integrated circuit, so that, during the contactless operating periods of the integrated circuit, the clock inputs ($E_1$, $E_2$) of the charge pump (10) are permanently connected to the terminals of the coil (L), the capacitance ($C_E$) of the charge pump seen from its clock inputs ($E_1$, $E_2$) forms a permanent component of the tuning capacitance (CA) of the tuned resonant circuit (36).

7. Integrated circuit (40) according to claim 6, wherein said first switches (41, 42) are controlled by a signal (CTL) representative of the operating mode of the integrated circuit.

8. Integrated circuit according to claim 6, wherein the clock inputs ($E_1$, $E_2$) of the charge pump (10) are further-connected to the outputs ($H_1$, $H_2$) of an oscillator (43) by means of second switches (44, 45).

9. Integrated circuit according to claim 8, wherein said second switches (44, 45) are commanded to be closed during the contact operating periods of the integrated circuit.

10. Integrated circuit according to claim 8, wherein said second switches (44, 45) are controlled by means of a signal (/CTL) representative of the operating mode of the integrated circuit.

* * * * *